United States Patent
Lee et al.

(10) Patent No.: US 9,383,651 B2
(45) Date of Patent: Jul. 5, 2016

(54) MASKLESS EXPOSURE DEVICE

(71) Applicant: Samsung Display Co., Ltd., Yongin, Gyeonggi-Do (KR)

(72) Inventors: Hi Kuk Lee, Yongin-si (KR); Tsunemitsu Torigoe, Hwaseong-si (KR); Chang Hoon Kim, Asan-si (KR); Ki Beom Lee, Seoul (KR); Su-Yeon Sim, Seoul (KR); Sang Hyun Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 207 days.

(21) Appl. No.: 14/189,663

(22) Filed: Feb. 25, 2014

(65) Prior Publication Data

US 2014/0340662 A1 Nov. 20, 2014

(30) Foreign Application Priority Data

May 20, 2013 (KR) ........................ 10-2013-0056645

(51) Int. Cl.
*G03F 7/20* (2006.01)

(52) U.S. Cl.
CPC ........ *G03F 7/70158* (2013.01); *G03F 7/70291* (2013.01)

(58) Field of Classification Search
CPC ........... G02B 26/0808; G02B 26/0841; G02B 5/1828; G03F 7/70291; G03F 7/70283; G03F 7/2057; G03F 7/70158
See application file for complete search history.

(56) References Cited

U.S. PATENT DOCUMENTS

| | | | | |
|---|---|---|---|---|
| 5,661,592 A * | 8/1997 | Bornstein | .......... | G02B 26/0808 257/415 |
| 6,181,458 B1 * | 1/2001 | Brazas, Jr. | ......... | G02B 26/0808 359/290 |
| 6,233,087 B1 * | 5/2001 | Hawkins | .............. | G02B 5/1828 359/290 |
| 6,960,035 B2 | 11/2005 | Okazaki et al. | | |
| 7,116,462 B2 | 10/2006 | Ikeda | | |
| 7,133,122 B2 | 11/2006 | Okazaki | | |
| 7,317,511 B2 | 1/2008 | Yamazoe | | |
| 8,054,531 B2 | 11/2011 | Wang et al. | | |
| 8,057,963 B2 | 11/2011 | Eib et al. | | |
| 2004/0004592 A1 * | 1/2004 | Ikeda | ................. | G02B 26/0841 345/85 |
| 2005/0105157 A1 * | 5/2005 | Yun | ........................ | G09F 9/372 359/572 |
| 2007/0046771 A1 | 3/2007 | Luellau et al. | | |
| 2007/0109405 A1 | 5/2007 | Prigent | | |
| 2008/0055710 A1 * | 3/2008 | Yun | .................... | G02B 26/0808 359/291 |
| 2008/0210888 A1 * | 9/2008 | Inoue | .................. | G03F 7/70225 250/492.22 |
| 2010/0081072 A1 | 4/2010 | Iosad et al. | | |

FOREIGN PATENT DOCUMENTS

| | | |
|---|---|---|
| JP | 2004-240216 A | 8/2004 |
| JP | 2006-201692 A | 8/2006 |
| JP | 2009-246069 A | 10/2009 |
| JP | 4613098 B2 | 10/2010 |
| JP | 2012-042703 A | 3/2012 |
| KR | 10-0421871 B1 | 2/2004 |
| KR | 10-0812644 B1 | 3/2008 |

* cited by examiner

*Primary Examiner* — Steven H Whitesell Gordon
(74) *Attorney, Agent, or Firm* — Knobbe, Martens, Olson & Bear, LLP

(57) ABSTRACT

In an aspect, a grating light valve module including: a substrate; and a plurality of ribbons disposed on the substrate, wherein each of the ribbons includes an insulating layer, a conductive layer disposed on the insulating layer, and an anti-oxidation layer disposed on the conductive layer is provided.

13 Claims, 13 Drawing Sheets

FIG.6

| Time Duration (hr) | Reflectance (%) | | |
|---|---|---|---|
| | Comp. | Exp. 1 | Exp.2 |
| 0 | 100 | 100 | 100 |
| 24 | 85.2 | 96.2 | 99.9 |
| 48 | 78.5 | 94.8 | 99.7 |
| 96 | 72.4 | 92.1 | 99.6 |
| 120 | 65.6 | 90.5 | 99.3 |
| 144 | 58.7 | 88.4 | 99.0 |
| 168 | 52.1 | 87.4 | 98.8 |
| 192 | 45.3 | 86.8 | 98.5 |
| 216 | 39.7 | 85.9 | 98.3 |
| 240 | 35.4 | 85.6 | 98.1 |

MASKLESS EXPOSURE DEVICE

INCORPORATION BY REFERENCE TO ANY PRIORITY APPLICATIONS

Any and all priority claims identified in the Application Data Sheet, or any correction thereto, are hereby incorporated by reference under 37 CFR 1.57. For example, this application claims priority to and the benefit of Korean Patent Application No. 10-2013-0056645 filed in the Korean Intellectual Property Office on May 20, 2013, disclosure of which is herein incorporated by reference in its entirety.

BACKGROUND

1. Field

This disclosure relates to a light exposure device. For example, this disclosure relates to a maskless exposure device.

2. Description of the Related Technology

Photoresists and exposure masks are usually used in patterning thin films on a semiconductor device or a flat panel display. For example, a thin film is deposited on a substrate and a photoresist film is coated thereon. The photoresist film is exposed to light through an exposure mask and developed to form a photoresist pattern. The thin film is then etched by using the photoresist pattern to form a thin film pattern.

Since the cost for manufacturing a panel for a semiconductor device or a flat panel display is lowered as the size of the panel increase, it is a recent trend to enlarge the panel. However, the increase of the panel size may cause the increase of the size of the exposure mask, thereby increasing the cost for the exposure mask.

In addition, it may be difficult to form minute thin film patterns, for example, having a width equal to or smaller than about 1.5 μm by using the exposure mask.

Alternatively, a maskless light exposure may be used for patterning thin films on a semiconductor device or a flat panel display. A maskless exposure device illuminates an exposure beam directly on a photoresist film without a mask to form a photoresist pattern. Examples of maskless exposure technologies may include a digital micro-mirror device ("DMD") and a grating light valve ("GLV").

DMD may have a slow exposure speed and may not be adapted to a minute pattern with a width equal to or smaller than about 2 μm.

GLV may have a relatively large deviation in a direction perpendicular to a scanning direction of an exposure beam compared with a deviation in the scanning direction when forming a pattern with a width equal to or smaller than about 1.5 μm. Furthermore, a ribbon used in GLV may easily deteriorate.

SUMMARY

Some embodiments provide a grating light valve module including: a substrate; and a plurality of ribbons disposed on the substrate, wherein each of the ribbons includes an insulating layer, a conductive layer disposed on the insulating layer, and an anti-oxidation layer disposed on the conductive layer.

In some embodiments, the anti-oxidation layer may include a nitride.

In some embodiments, the anti-oxidation layer may include $AlN_3$.

In some embodiments, the anti-oxidation layer may include: an $AlN_3$ sublayer; and a $TiO_2$ sublayer disposed on the $AlN_3$ sublayer.

In some embodiments, a sum of a retardation of the $AlN_3$ sublayer and a retardation of the $TiO_2$ sublayer may range from about 550 nm to about 950 nm.

Some embodiments provide a light exposure device including: a light source; a lighting unit configured to receive a beam from the light source and to change a shape of the beam; a grating light valve module configured to switch the beam from the lighting unit; and a projection unit configured to receive the beam from the grating light valve module and to illuminate the received beam onto a substrate coated with a photoresist. In some embodiments, the grating light valve module includes: a substrate; and a plurality of ribbons disposed on the substrate, wherein each of the ribbons includes an insulating layer, a conductive layer disposed on the insulating layer; and an anti-oxidation layer disposed on the conductive layer.

In some embodiments, the anti-oxidation layer may include a nitride.

In some embodiments, the anti-oxidation layer may include $AlN_3$.

In some embodiments, the anti-oxidation layer may include: an $AlN_3$ sublayer; and a $TiO_2$ sublayer disposed on the $AlN_3$ sublayer.

In some embodiments, a sum of a retardation of the $AlN_3$ sublayer and a retardation of the $TiO_2$ sublayer may range from about 550 nm to about 950 nm.

BRIEF DESCRIPTION OF THE DRAWINGS

FIG. 6 is a table illustrating measured reflectance of GLV according to experimental examples and a comparative example.

DETAILED DESCRIPTION

Figure 1:
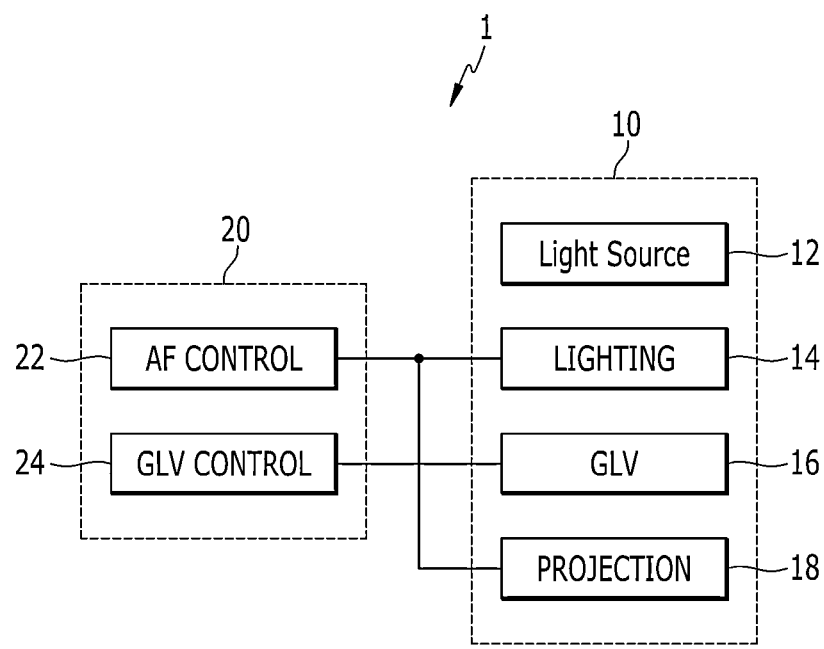
FIG. 1 is a schematic block diagram of a maskless exposure device according to an embodiment.

Aspects of the embodiments will be described more fully hereinafter with reference to the accompanying drawings. As those skilled in the art would realize, the described embodiments may be modified in various different ways, all without departing from the spirit or scope of the embodiments. In the drawing, the same or similar reference numerals designate the same or similar elements throughout the specification.

It will be understood that when an element such as a layer, film, region, or substrate is referred to as being "on" another element, it can be directly on the other element or intervening elements may also be present.

A maskless exposure device according to an embodiment of the present disclosure is described in detail with reference to FIG. 1 to FIG. 5.

Figure 2:
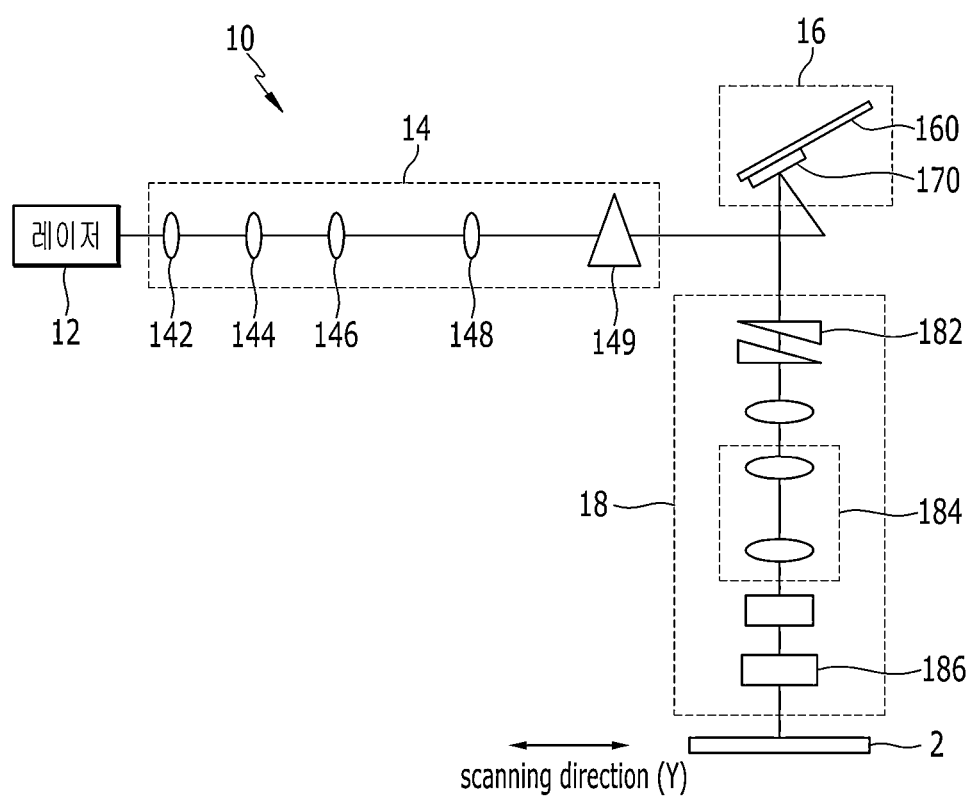
FIG. 2 is a schematic diagram of an optical unit of the maskless exposure device according to an embodiment.
Figure 3:
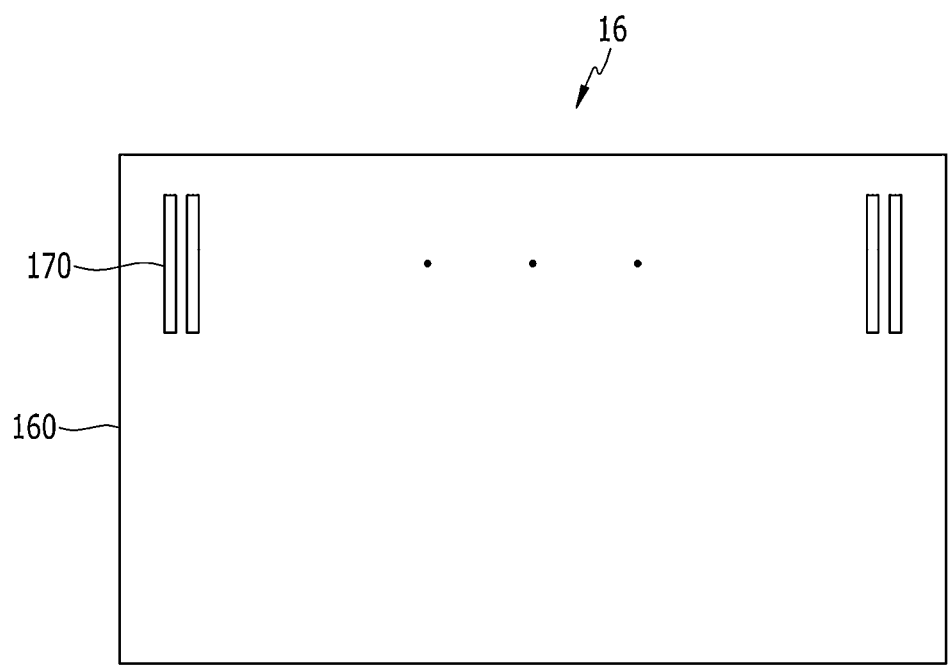
FIG. 3 is a schematic plan view of a grating light valve according to an embodiment.
Figure 4:
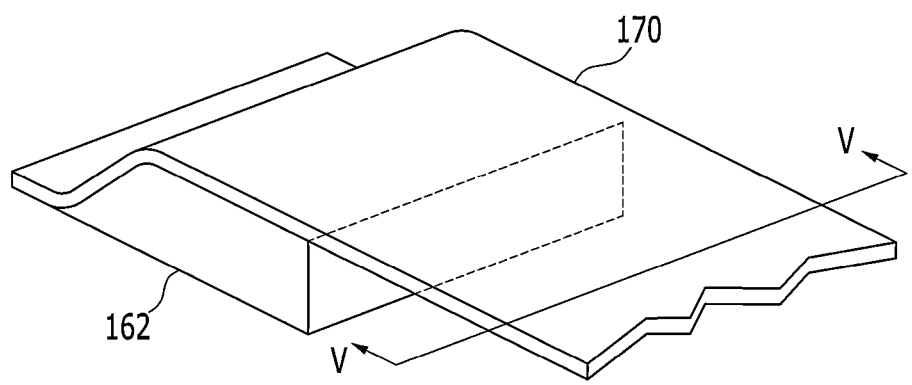
FIG. 4 a schematic perspective view of a ribbon for a grating light valve according to an embodiment.
Figure 5:
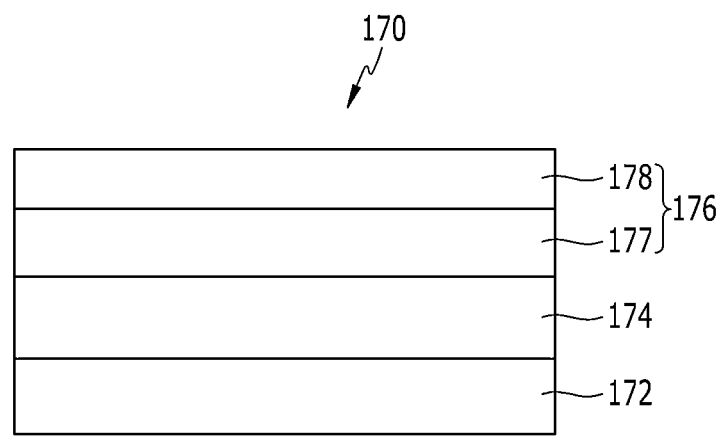
FIG. 5 is a schematic sectional view of the ribbon for a grating light valve shown in FIG. 4 taken along line V-V.

FIG. 1 is a schematic block diagram of a maskless exposure device according to an embodiment, FIG. 2 is a schematic diagram of an optical unit of the maskless exposure device according to an embodiment, FIG. 3 is a schematic plan view of a grating light valve according to an embodiment, FIG. 4 a schematic perspective view of a ribbon for a grating light valve according to an embodiment, and FIG. 5 is a schematic sectional view of the ribbon for a grating light valve shown in FIG. 4 taken along line V-V.

Referring to FIG. 1, a maskless exposure device 1 according to an embodiment includes an optical unit 10 and a control unit 20.

The optical unit 10 includes a light source 12, a lighting unit 14, a grating light valve module ("GLV") module 16, and a projection unit 18, and the control unit 20 an auto focusing ("AF") controller 22 and a GLV controller 24. In some embodiments, the AF controller 22 is connected to the lighting unit 14 and the projection unit 18 and controls the lighting unit 14 and the projection unit 18, and the GLV controller 24 controls the GLV module 16.

Referring to FIG. 2, the light source 12 may include a laser generating a laser beam, for example. In some embodiments, the wavelength of the laser beam may be about 405 nm or about 355 nm.

In some embodiments, the lighting unit 14 may spread, collimate, and attenuate the light from the light source 12 to form a beam having a proper shape and a proper intensity, and the light unit includes a plurality of lenses 142, 144, 146 and 148 an attenuator 149 that are arranged in series. In some embodiments, the plurality of lenses 142, 144, 146 and 148 may be a Powell lens 142, an x focusing lens 144, a y collimating lens 146, and a condensing lens 148.

In some embodiments, the Powell lens 142 spreads the incident laser beam.

In some embodiments, the x focusing lens 144 and the y collimating lens 146 may correct the shape of the laser beam. In some embodiments, the x focusing lens 144 may correct an x position of the laser beam, and the y collimating lens 146 may correct a y position or a width of the laser beam. In some embodiments, the positions of the x focusing lens 144 and the y collimating lens 146 may be exchanged.

In some embodiments, the condensing lens 148 may control a slope of x directional main light beam, and the attenuator 149 may control the transmittance of the laser beam.

In some embodiments, the lighting unit 14 may further include a lens (not shown) that converts the shape of the laser beam from a Gaussian intensity distribution to a constant intensity distribution.

In some embodiments, the lighting unit 14 may further include a mirror that changes a proceeding direction of the laser beam. In some embodiments, the lenses 142, 144, 146 and 148 and the attenuator 149 may not be aligned on a straight line but on a curved line.

In some embodiments, the lighting unit 14 may further include a beam shifter (not shown) or a beam sampler (not shown). In some embodiments, the beam sampler may reflect only a little of the laser beam outputted from the attenuator 149 to measure the light amount.

The projection unit 18 may include an x shifter 182, an objective lens 186, and a plurality of lenses 184. In some embodiments, the x shifter 182 may receive the light from the GLV module 16 and includes a wedge-shaped prism. In some embodiments, the objective lens 186 may illuminate a leaser beam on a substrate 2 coated with a photoresist. In some embodiments, the lenses 184 are disposed between the x shifter 182 and the objective lens 186, and may correct multiplication.

In the above description, y axis is substantially parallel to a proceeding direction of the laser beam from the light source, and x axis is substantially perpendicular to y axis.

Referring to FIG. 2 and FIG. 3, the GLV module 16 includes a substrate 160 and a plurality of ribbons 170 disposed thereon. Referring to FIG. 4, both ends of each of the ribbons 170 are disposed on the substrate 160, and the rest portion of the ribbon 170 is spaced apart from the substrate 160 by a support 162. In some embodiments, the support 162 is disposed on the substrate 160 and under the ribbon 170, and spaced apart from the ends of the ribbon 170 to make a gap between a center portion of the ribbon 170 and the substrate 160.

Referring to FIG. 5, each of the ribbons 170 includes an insulating layer 172, a conductive layer 174, and an anti-oxidation layer 176 that are deposited in sequence.

In some embodiments, the insulating layer 172 may include $Si_3N_4$ and the conductive layer 174 may include aluminum (Al).

In some embodiments, the anti-oxidation layer 176 may reduce or prevent the conductive layer 174 from being oxidized, and may include a nitride layer, for example. In some embodiments, the anti-oxidation layer 176 may include a highly refractive material that may enhance the efficiency of the reflection of a laser beam. In some embodiments, the anti-oxidation layer 176 may have a multi-layered structure including an $AlN_3$ sublayer 177 and a $TiO_2$ sublayer 178. In some embodiments, the thickness of the $AlN_3$ sublayer 177 and the $TiO_2$ sublayer 178 may be determined so that the total optical retardation of the sublayers 177 and 178 may be integer times half of the wavelength of the laser beam, for example, from about 550 nm to about 950 nm, thereby increasing the reflective efficiency.

In some embodiments, the anti-oxidation layer 176 may have a single layered structure.

In some embodiments, the anti-oxidation layer 176 on the conductive layer 174 of the ribbon 170 in the GLV module 16 may reduce oxidation of GLV and may increase the lifetime of GLV.

GLV according to experimental examples and a comparative example is described in detail.

Figure 7:
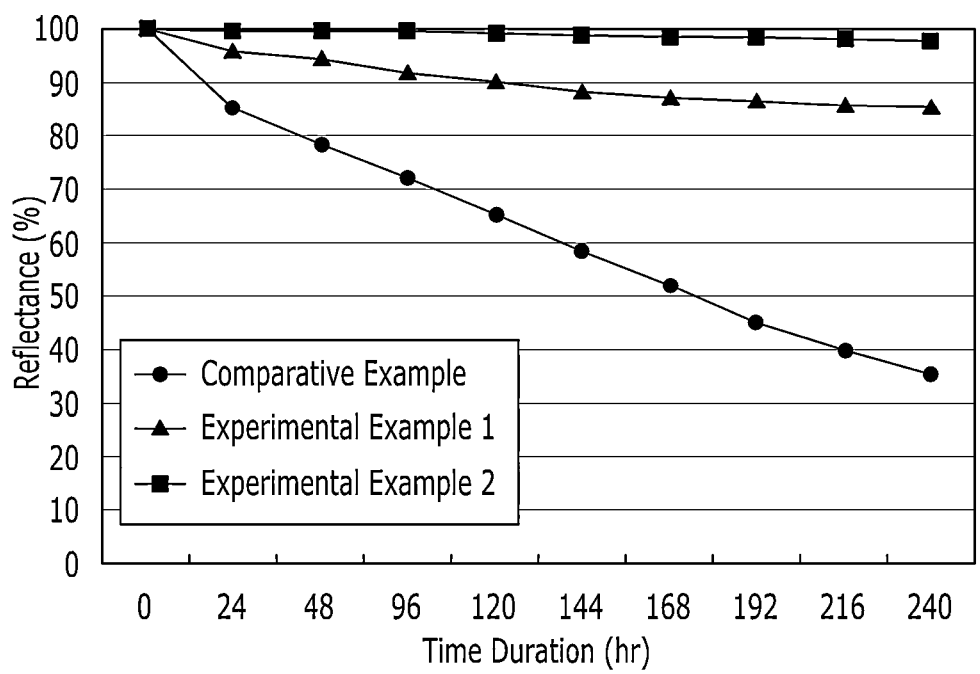
FIG. 7 is a graph illustrating measured reflectance of GLV according to experimental examples and a comparative example.

FIG. 6 is a table illustrating measured reflectance of GLV according to experimental examples and a comparative example, and FIG. 7 is a graph illustrating measured reflectance of GLV according to experimental examples and a comparative example.

GLVs according to Experimental Example 1, Experimental Example 2, and a Comparative Example were manufactured, and were tested at a high temperature of about 60° C. and high humidity of about 95%. The Comparative Example omitted the $AlN_3$ sublayer 177 and the $TiO_2$ sublayer 178 in the structure shown in FIG. 5. Experimental Example 1 omitted the $TiO_2$ sublayer 178 in the structure shown in FIG. 5, and Experimental Example 2 has the same structure shown in FIG. 5.

Referring to FIG. 6 and FIG. 7, Experimental Example 2 having both the $AlN_3$ sublayer 177 and the $TiO_2$ sublayer 178 shows the best reflective property. Experimental Example 1 having only the $AlN_3$ sublayer 177 shows excellent reflective property compared with the Comparative Example without the $AlN_3$ sublayer 177 and the $TiO_2$ sublayer 178.

Next, a maskless exposure device including GLVs and a GLV controller according to an embodiment is described in detail with reference to FIG. 8 to FIG. 11.

Figure 8:
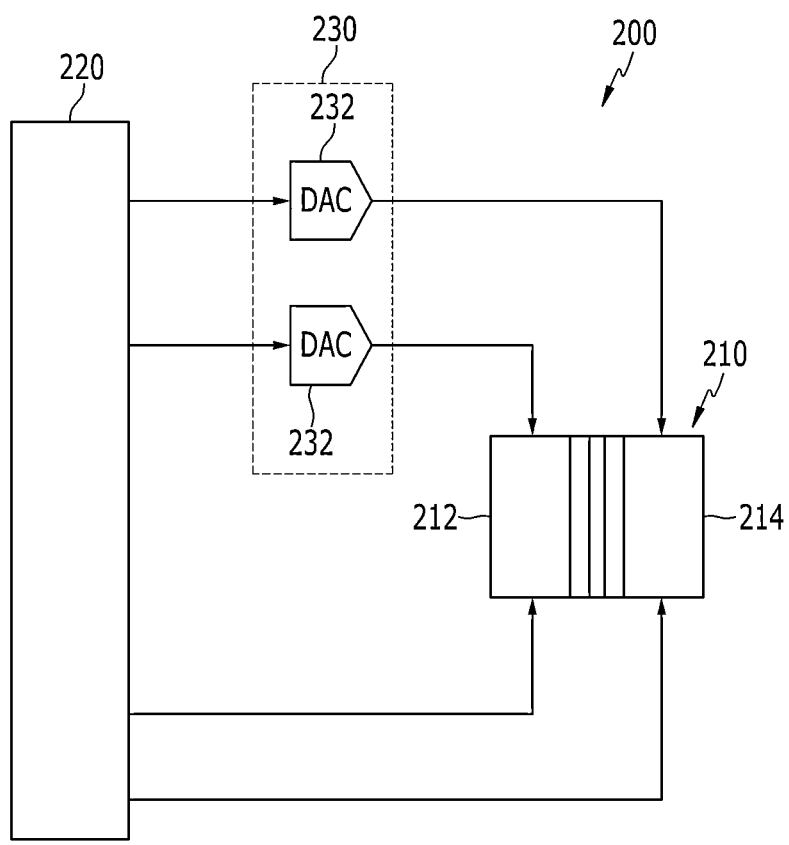
FIG. 8 is a schematic block diagram of a maskless exposure device including GLVs and a GLV controller according to an embodiment.
Figure 9:
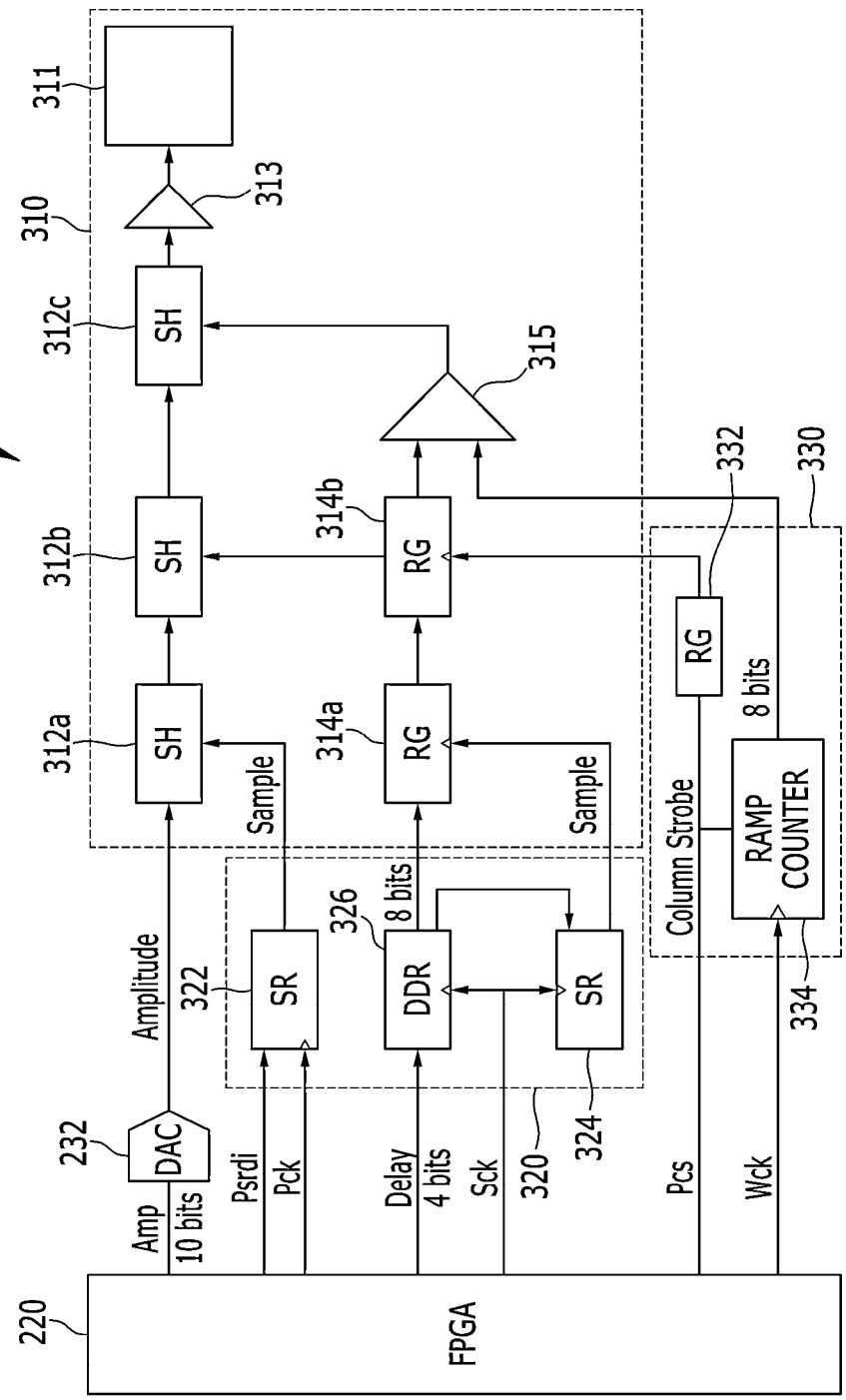
FIG. 9 is a schematic block diagram of a GLV cell block according to an embodiment.
Figure 10:
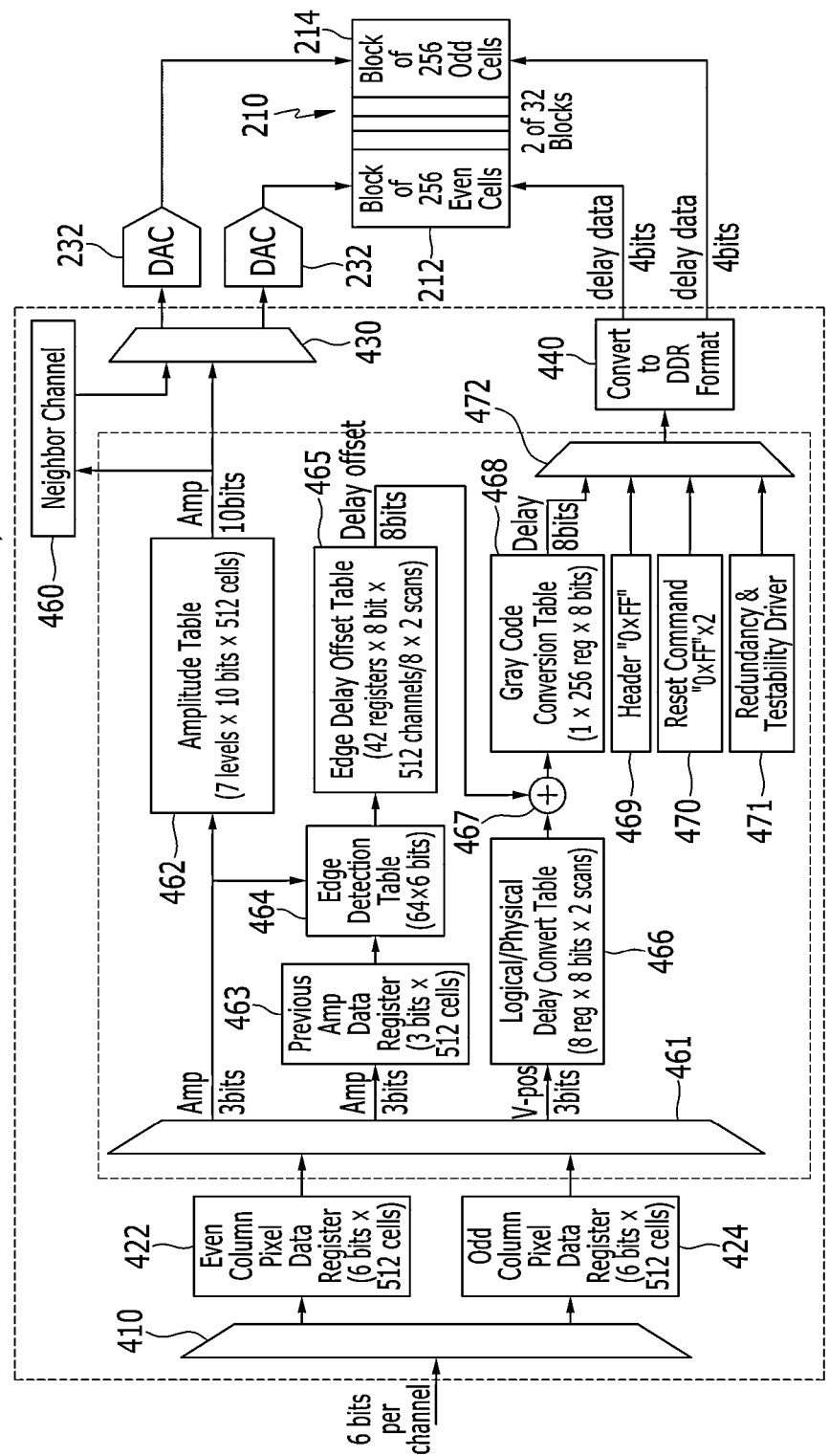
FIG. 10 a schematic block diagram of the GLV controller according to an embodiment.
Figure 11:
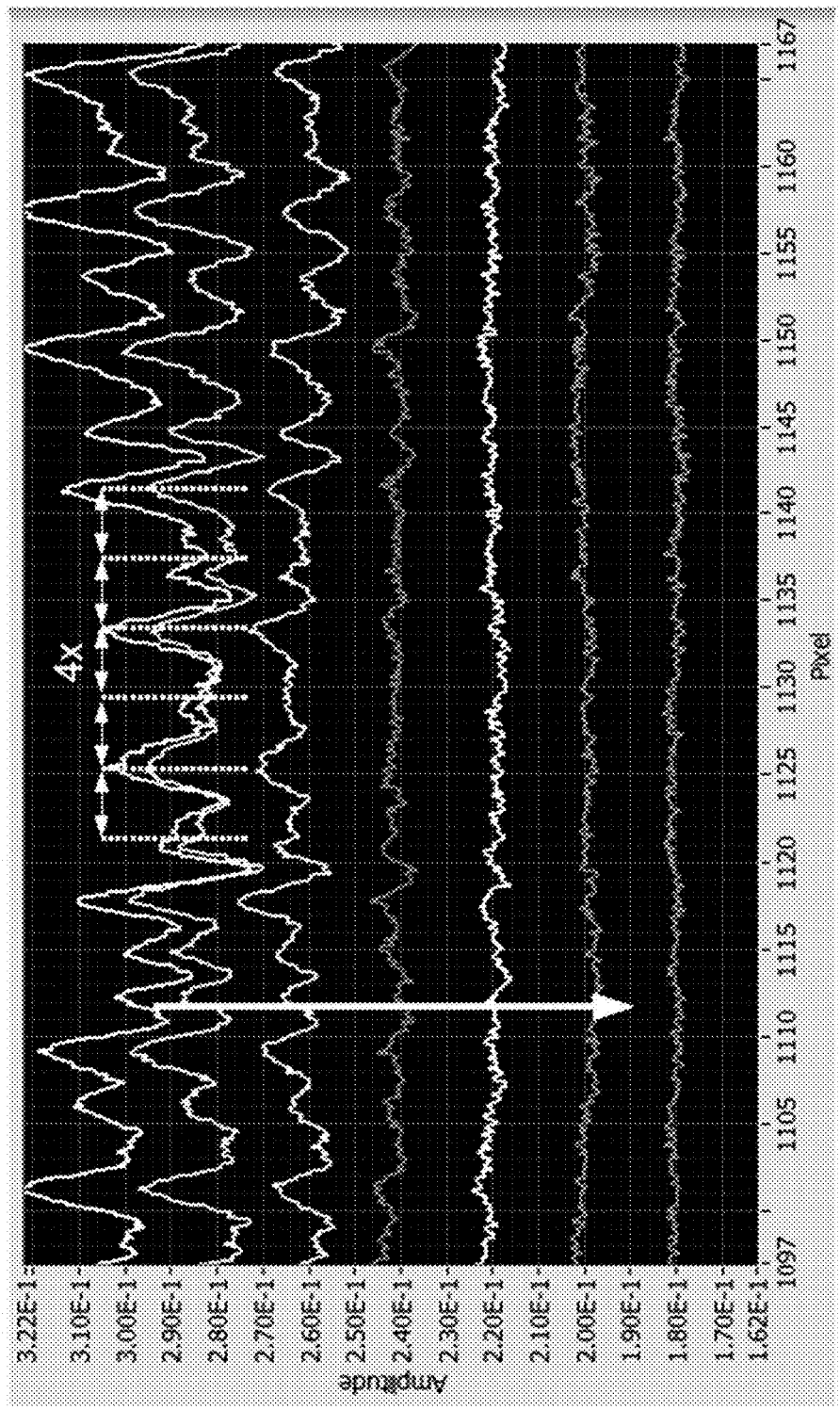
FIG. 11 is a graph illustrating an amplitude signal outputted from a maskless exposure device as function of pixels according to an experimental example and a comparative example.

FIG. 8 is a schematic block diagram of a maskless exposure device including GLVs and a GLV controller according to an embodiment, FIG. 9 is a schematic block diagram of a GLV cell block according to an embodiment, FIG. 10 a schematic block diagram of the GLV controller according to an embodiment, and FIG. 11 is a graph illustrating an amplitude signal outputted from a maskless exposure device as function of pixels according to an experimental example and a comparative example.

Referring to FIG. 8, a maskless exposure device 200 according to an embodiment includes a GLV unit 210, a GLV control unit 220, and a data conversion unit 230.

In some embodiments, the GLV unit 210 includes a plurality of GLV cell blocks 212 and 214, and the GLV cell blocks 212 and 214 may include a plurality of even GLV cell blocks 212 and a plurality of odd GLV cell blocks 214, respectively. In some embodiments, each of the even GLV cell blocks 212 includes a plurality of even GLV cells, for example, about 256 even GLV cells. In some embodiments, each of the odd GLV cell blocks 214 includes a plurality of odd GLV cells, for example, about 256 odd GLV cells. In some embodiments, the number of the GLV cell blocks 212 and 214 included in the GLV unit 210 may be about 32, for example.

In some embodiments, the data conversion unit 230 includes a plurality of digital-to-analog converters 232, and is connected between the GLV control unit 220 and the cell blocks 212 and 214.

In some embodiments, the GLV control unit 220 is connected to the data conversion unit 230 and the GLV unit 210, and may include a field-programmable gate array ("FPGA"), for example.

Referring to FIG. 9, each of the GLV blocks 300 include a GLV cell 310, a data interface 320, and a global block logic 330.

In some embodiments, the GLV cell 310 may include a pixel 311, first to third sample-hold unit (SH) 312a, 312b and 312c, an amplifier 313, first and second registers (RG) 314a and 314b, and a comparator 315.

In some embodiments, the data interface 320 includes a first shift register (SR) 322, a second shift register 324, and a double data rate ("DDR") interface 326.

In some embodiments, the global block logic 330 includes a register 332 and a ramp counter 334.

In some embodiments, the DDR interface 326 in the data interface 320 has an input terminal connected to the GLV control unit 220, an output terminal connected to an input terminal of the first register 314a and the second shift register 324, and a clock terminal connected to the GLV control unit 220 and receiving a clock signal Sck. In some embodiments, the DDR interface 326 may convert four-bit delay data from the GLV control unit 220 into eight-bit data based on a clock signal Sck from the GLV control unit 220.

In some embodiments, the first shift register 322 has an input terminal connected to the GLV control unit 220 and receiving a signal Psrdi from the GLV control unit 220, an output terminal connected to an input terminal of the first sample-hold unit 312a, and a clock terminal connected to the GLV control unit 220 and receiving the clock signal Pck from the GLV control unit 220. In some embodiments, the first shift register 322 may shift and output the signal Psrdi from the GLV control unit 220 based on the clock signal Pck from the GLV control unit 220.

In some embodiments, the second shift register 324 has an input terminal connected to an output terminal of the DDR interface 326, an output terminal connected to a clock terminal of the first register 314a, and a clock terminal connected to the GLV control unit 220 and receiving the clock signal Sck. The second shift register 324 may shift and output a signal from the DDR interface 326 based on the clock signal Sck from the GLV control unit 220.

In some embodiments, the ramp counter 334 included in the global block logic 330 has an input terminal connected to the GLV control unit 220 and receiving a signal Pcs from the GLV control unit 220, an output terminal connected to an input terminal of the comparator 315, and a clock terminal connected to the GLV control unit 220 and receiving a clock signal Wck. In some embodiments, the ramp counter 334 may count the signal Pcs from the GLV control unit 220 to generate an eight-bit signal based on the clock signal Wck from the GLV control unit 220.

In some embodiments, the register 332 included in the global block logic 330 has an input terminal connected to the GLV control unit 220 and receiving the signal Pcs from the GLV control unit 220, and an output terminal connected to a clock terminal of the second register 314b in the GLV cell 310.

In some embodiments, the first and second registers 314a and 314b included in the GLV cell 310 are connected in series. In some embodiments, the first register 314a has an input terminal connected to the DDR interface 326 of the data interface 320, an output terminal connected to the second register 314b, and a clock terminal connected to the second shift register 324. In some embodiments, the second register 314b has an input terminal connected to the output terminal of the first register 314a, an output terminal connected to the comparator 315, a clock terminal connected to the register 332 of the global block logic 330. In some embodiments, the first register 314a and the second register 314b may delay an eight-bit signal from the DDR interface 326.

In some embodiments, the comparator 315 has a first input terminal connected to the output terminal of the second register 314b and a second input terminal connected to the ramp counter 334 of the global block logic 330, and the output terminal connected to an input terminal of the third sample-hold unit 312c. In some embodiments, the comparator 315 may compare a signal from the second register 314b and a signal from the ramp counter 334 and output a result of the comparison.

In some embodiments, the first to third sample-hold units 312a, 312b and 312c are connected in series. In some embodiments, the first sample-hold unit 312a has an input terminal connected to the digital-to-analog converter 232 and an input terminal connected to the first shift register 322 of the data interface 320, and the output terminal connected to the second sample-hold unit 312b. In some embodiments, the second sample-hold unit 312b has an input terminal connected to the output terminal of the first sample-hold unit 312a and an input terminal connected to the second register 314b. In some embodiments, the third sample-hold unit 312c has an input terminal connected to the output terminal of the second sample-hold unit 312b and an input terminal connected to the comparator 315, and an output terminal connected to the amplifier 313.

In some embodiments, the first sample-hold unit 312a may sample and hold an amplitude of a signal or analog data from the digital-to-analog converter 232 based on a signal from the first shift register 322 of the data interface 320. In some embodiments, the second sample-hold unit 312b may sample and hold an amplitude of a signal from the first sample-hold unit 312a based on a signal from the second register 314b. In some embodiments, the third sample-hold unit 312c may sample and hold a signal from the second sample-hold unit 312b based on a signal from the comparator 315.

In some embodiments, the amplifier 313 has an input terminal connected to the third sample-hold unit 312c, and the output terminal connected to a pixel 311. The amplifier 313 may receive and amplify a signal from the third sample-hold unit 312c and transmit the amplified signal to the pixel 311.

Referring to FIG. 10, the GLV control unit 400, for example, FPGA includes a plurality of channels 460 and a plurality of portions connected to the channels 460. For example, the GLV control unit 400 includes a first data distributor 410, a pair of pixel data registers 422 and 424, a second data distributor 430, and a DDR converter 440.

In some embodiments, the pixel data register 422 includes an even-column pixel data register 422. In some embodiments, the pixel data register 424 includes an odd-column pixel data register 424.

In some embodiments, the first data distributor 410 may receive pixel data by six bits per channel from an external device, and may divide the pixel data into even-column pixel data and odd-column pixel data to be outputted. In some embodiments, the even-column pixel data register 422 may receive and store the even-column pixel data from the first data distributor 410 and may transmit the even-column pixel data to the channel 460. In some embodiments, the odd-column pixel data register 424 may receive and store the odd-column pixel data from the first data distributor 410 and may transmit the odd-column pixel data to the channel 460.

In some embodiments, the channel 460 includes a third data distributor 461, an amplitude table 462, a previous amplitude data register 463, an edge detection table 464, an edge delay offset table 465, a logical/physical delay convert table 466, an add-and-limiter 467, a gray code conversion table 468, a header register 469, a reset command register 470, a redundancy and testability driver 471, and a multiplexer 472.

In some embodiments, the third data distributor 461 may receive pixel data from the pixel data registers 422 and 424, and may divide the pixel data into two 3-bit amplitude data Amp and a 3-bit position or phase data V-pos to be outputted.

In some embodiments, the amplitude table 462 may convert the 3-bit amplitude data from the third data distributor 461 into 7-level 10-bit amplitude data, for example.

In some embodiments, the 10-bit amplitude data from the amplitude table 462 along with 10-bit amplitude data from an adjacent channel may be inputted into the second data distributor 430, and may be then inputted into the digital-to-analog converters 232.

In some embodiments, the previous amplitude data register 463 may store and delay the amplitude data from the third data distributor 461, and may output the delayed amplitude data. In some embodiments, the edge detection table 464 may detect edge based on current amplitude data from the third data distributor 461 and the previous amplitude data from the previous amplitude data register 463. In some embodiments, the edge delay offset table 465 may calculate edge delay offset based on the data from the edge detection table 464.

In some embodiments, the phase data V-pos from the third data distributor 461 may be converted by the logical/physical delay convert table 466, and then the converted data along with the delay offset from the edge delay offset table 465 may be added and limited by the add-and-limiter 467 and may inputted to the gray code conversion table 468. In some embodiments, the add-and-limiter 467 may limit 8-bit delay sum into a predetermined range, for example, between a minimum value and a maximum value.

In some embodiments, the delay value converted by the gray code conversion table 468 along with signals from the header register 469, the reset command register 470, and the redundancy and testability driver 471 may be inputted into the multiplexer 472 to be outputted selectively.

In some embodiments, the DDR converter 440 may divide 8-bit data from the multiplexer 472 into two 4-bit delay data and may output the 4-bit delay data to the GLV cell blocks 212 and 214.

As described above, the data interface 320 including the DDR interface 326 and the first and second shift registers 322 and 324 is added to the GLV cell block 300, and the first and second registers 314a and 314b are placed in the GLV cell 310. Therefore, the device may process digital data instead of analog data and a conventional analog delay circuit may be removed.

For example, referring to FIG. 11, a conventional maskless exposure device that has no DDR interface, and includes a pair of sample-hold units that processes analog data instead of the first and second registers 314a and 314b may cause a delay of about 100 ns in switching time due to the analog delay and thus the amplitude may abruptly increase in a period of about 4 pixels. However, the maskless exposure device according to the present embodiments may show a substantially uniform amplitude.

Thin film patterns formed using a maskless exposure device according to an experimental example and a comparative example are described in detail with reference to FIG. 12 and FIG. 13.

Figure 12:
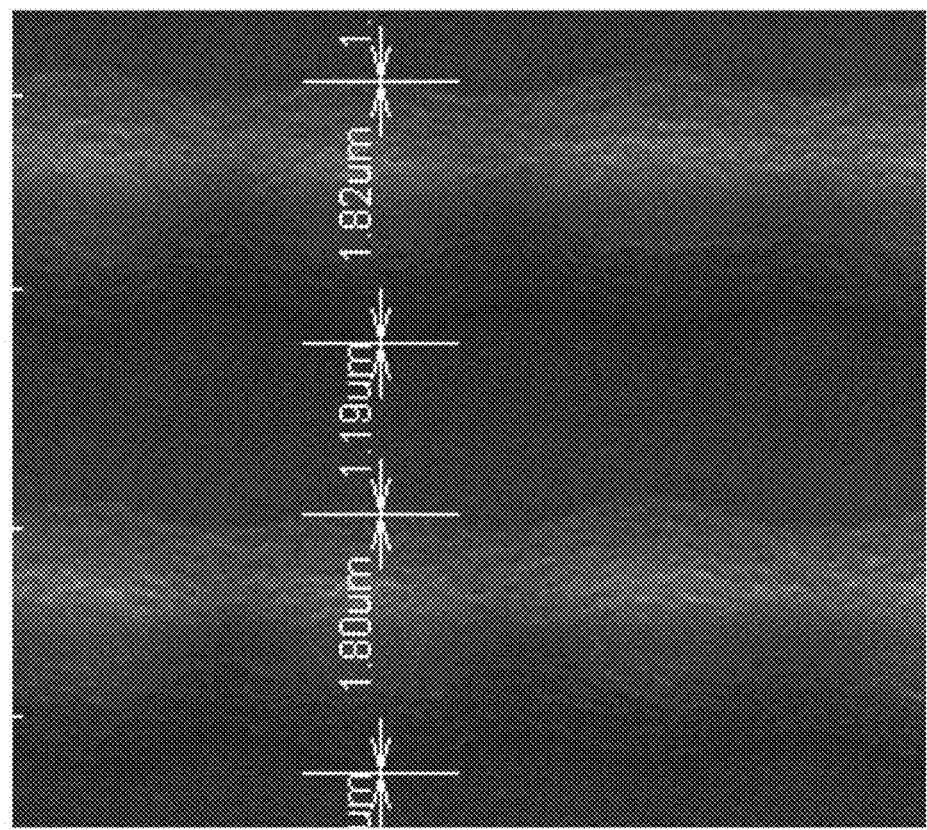
FIG. 12 is a photograph of a thin film pattern formed using a maskless exposure device according to a comparative example.
Figure 13:
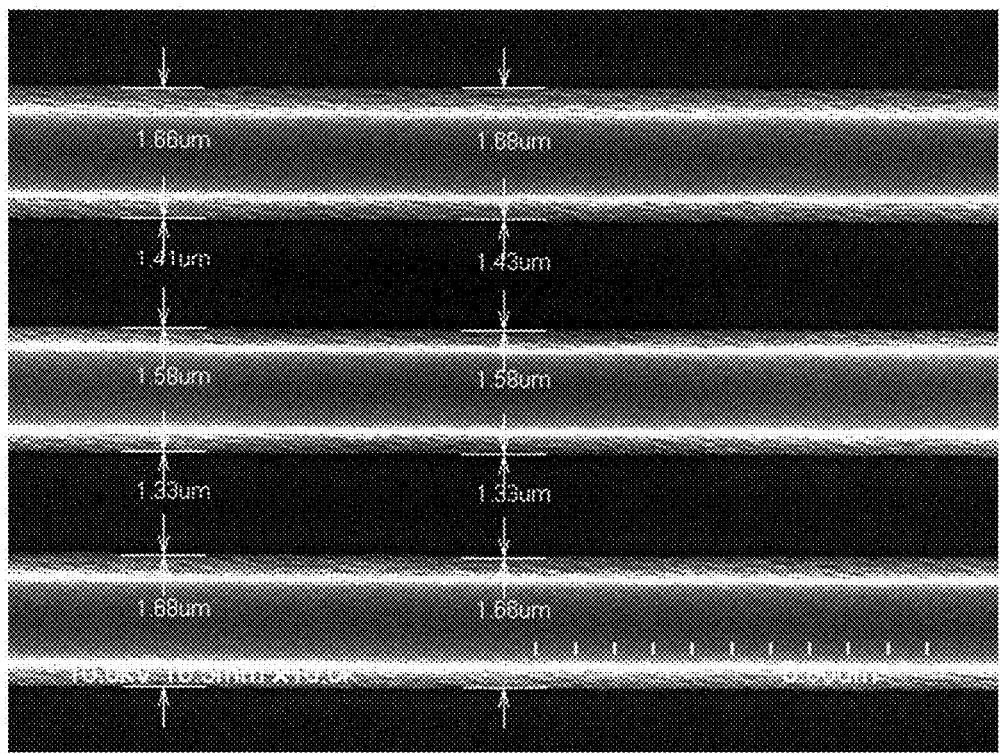
FIG. 13 is a photograph of a thin film pattern formed using a maskless exposure device according to an experimental example.

FIG. 12 is a photograph of a thin film pattern formed using a maskless exposure device according to a comparative example, and FIG. 13 is a photograph of a thin film pattern formed using a maskless exposure device according to an experimental example.

Referring to FIG. 12, a thin film pattern formed using a maskless exposure device according to a comparative example has non-uniform widths and hardly obtains an inter-line distance of about 1.5 μm. However, referring to FIG. 13, a thin film pattern formed using a maskless exposure device according to an experimental example has a uniform line width and shows an inter-line distance of about 1.5 μm and a line edge roughness (LER) of about 0.2 μm.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A grating light valve module comprising:
a substrate; and
a plurality of ribbons disposed on the substrate,
wherein each of the ribbons comprises:
an insulating layer;
a conductive layer disposed on the insulating layer; and
an anti-oxidation layer disposed on the conductive layer,
wherein the anti-oxidation layer comprises $AlN_3$.

2. The module of claim 1, wherein the anti-oxidation layer comprises:
an $AlN_3$ sublayer; and
a $TiO_2$ sublayer disposed on the $AlN_3$ sublayer.

3. The module of claim 2, wherein a sum of a retardation of the $AlN_3$ sublayer and a retardation of the $TiO_2$ sublayer ranges from about 550 nm to about 950 nm.

4. The module of claim 1, wherein the insulating layer comprises $Si_3N_4$.

5. The module of claim 1, wherein the conductive layer comprises aluminum (Al).

6. A light exposure device comprising:
a light source;
a lighting unit configured to receive a beam from the light source and to change a shape of the beam;
a grating light valve module configured to switch the beam from the lighting unit; and
a projection unit configured to receive the beam from the grating light valve module and to illuminate the received beam onto a substrate coated with a photoresist,
wherein the grating light valve module comprises:
a substrate; and
a plurality of ribbons disposed on the substrate, wherein each of the ribbons comprises:
an insulating layer;
a conductive layer disposed on the insulating layer; and
an anti-oxidation layer disposed on the conductive layer, wherein the anti-oxidation layer comprises $AlN_3$.

7. The device of claim 6, wherein the anti-oxidation layer comprises:
an $AlN_3$ sublayer; and
a $TiO_2$ sublayer disposed on the $AlN_3$ sublayer.

8. The device of claim 7, wherein a sum of a retardation of the $AlN_3$ sublayer and a retardation of the $TiO_2$ sublayer ranges from about 550 nm to about 950 nm.

9. The device of claim 6, wherein the insulating layer comprises $Si_3N_4$.

10. The device of claim 6, wherein the conductive layer comprises aluminum (Al).

11. The device of claim 6, wherein the lighting unit comprises a plurality of lenses.

12. The device of claim 11, wherein the plurality of lenses comprises at least one of a Powell lens, an x-axis focusing lens, a y-axis collimating lens and a condensing lens, wherein the y-axis is substantially parallel to the direction the beam is received by the lighting unit and the x-axis is substantially perpendicular to the y-axis.

13. The device of claim 6, wherein the projection unit comprises an x shifter, an objective lens, and a plurality of lenses.

* * * * *